United States Patent
Eisenberger et al.

(10) Patent No.: US 7,058,309 B1
(45) Date of Patent: Jun. 6, 2006

(54) OPTOELECTRONIC TRANSCEIVER

(75) Inventors: Christian Eisenberger, Ruhpolding (DE); Herbert Pronold, Traunreut (DE); Peter Speckbacher, Kirchweidach (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 09/744,871

(22) PCT Filed: Jul. 14, 1999

(86) PCT No.: PCT/EP99/04972

§ 371 (c)(1),
(2), (4) Date: Jul. 11, 2001

(87) PCT Pub. No.: WO00/07052

PCT Pub. Date: Feb. 10, 2000

(30) Foreign Application Priority Data

Jul. 29, 1998 (DE) ................ 198 34 090

(51) Int. Cl.
*H04B 10/00* (2006.01)

(52) U.S. Cl. .............. 398/135; 398/138; 398/139; 398/136; 398/137; 398/128; 398/129; 398/130; 398/131; 398/41; 398/42; 385/88; 385/89; 385/92; 385/93; 385/94; 385/14; 385/49; 385/33

(58) Field of Classification Search ............. 398/135, 398/138, 139, 164, 136, 137, 128, 131, 129, 398/130, 41, 42; 385/88, 89, 92, 93, 94, 385/14, 49, 33
See application file for complete search history.

(56) References Cited

U.S. PATENT DOCUMENTS

| | | | |
|---|---|---|---|
| 4,292,512 A | 9/1981 | Miller et al. | |
| 5,140,152 A | 8/1992 | Van Zeghbroeck | |
| 5,146,516 A | 9/1992 | Blümke et al. | |
| 5,262,884 A * | 11/1993 | Buchholz | 398/134 |
| 5,555,334 A | 9/1996 | Ohnishi et al. | |
| 5,787,215 A * | 7/1998 | Kuhara et al. | 385/88 |
| 5,852,322 A | 12/1998 | Speckbacher | |

FOREIGN PATENT DOCUMENTS

| | | |
|---|---|---|
| DE | 26 29 356 | 1/1978 |
| DE | 31 09 887 | 9/1982 |
| DE | 38 09 396 | 10/1989 |
| DE | 38 11 723 | 10/1989 |
| DE | 44 35 928 | 4/1995 |

(Continued)

OTHER PUBLICATIONS

English language abstract of Japanese publication 8-179169, Patent Abstracts of Japan, Dec. 22, 1994, p. 1.

(Continued)

*Primary Examiner*—Hanh Phan
(74) *Attorney, Agent, or Firm*—Brinks Hofer Gilson & Lione

(57) ABSTRACT

An optoelectronic transceiver including an optoelectronic transmitting unit disposed along an optical axis and having a radiation-emitting layer region and an active radiation-sensitive layer region. The optoelectronic transceiver further including an optoelectronic receiving unit disposed along the optical axis and is disposed in bridge-like fashion above the optoelectronic transmitting unit. The optoelectronic receiving unit having an active radiation-sensitive layer region disposed perpendicular to the optical axis and located in a thin membrane, which is disposed immediately in front of the radiation-emitting layer region of the optoelectronic transmitting unit, and a radiation-emitting layer region.

21 Claims, 6 Drawing Sheets

FOREIGN PATENT DOCUMENTS

| | | |
|---|---|---|
| DE | 197 27 632 | 1/1999 |
| EP | 0 053 742 | 6/1982 |
| EP | 0 120 457 | 10/1984 |
| EP | 34 06 424 | 2/1985 |
| EP | 0 290 242 | 11/1988 |
| EP | 0 410 143 | 1/1991 |
| FR | 2 443 071 | 6/1980 |
| GB | 2 136 239 | 9/1984 |
| JP | 8-179169 | 7/1996 |
| WO | WO 96/36999 | 11/1996 |

OTHER PUBLICATIONS

Pending Patent Application Assigned to Dr. Johannes Heidenhain GmbH: U.S. Appl. No. 09/646,801, filed Sep. 22, 2000, Franz et al.

* cited by examiner

OPTOELECTRONIC TRANSCEIVER

Applicants claim, under 35 U.S.C. § 119, the benefit of priority of the filing date of Jul. 29, 1998 of a German patent application, copy attached, Ser. No. 198 34 090.7, filed on the aforementioned date, the entire contents of which is incorporated herein by reference.

BACKGROUND OF THE INVENTION

1. Field of the Invention

The present invention relates to an optoelectronic transceiver, or transmitting and receiving unit, as generically defined by the preamble to claim 1, which is suitable in particular for bidirectional data transmission by means of optical waveguides.

2. Description of the Related Art

For bidirectional data transmission via optical waveguides, optoelectronic transmitting units and receiving units or so-called transceivers are necessary on the various ends of the optical waveguides. One possibility for designing such transceivers is known for instance from European Patent Disclosure EP 0 410 143 A2. This reference provides that an optoelectronic transmitting unit and an optoelectronic receiving unit are disposed at an angle of 90° to one another. Via a suitable tee coupler or beam splitter element, it is assured that the radiation emitted by the transmitting unit is injected into an optical waveguide, and the radiation coming from the optical waveguide is deflected in the direction of the receiving unit. Such transceivers, however, require great effort and expense for exact adjustment or disposition of the two transmission and receiving units relative to the tee coupler and the optical waveguide. Furthermore, this arrangement always requires a suitable tee coupler; in other words, the number of components required is high.

In Japanese Patent Disclosure JP 8-179169, it is therefore provided that the transmitting unit and the receiving unit are disposed along a common optical axis, and this axis is identical to the optical axis of the optical waveguide. The receiving unit here is disposed adjacent to the exit face of the optical waveguide; behind or facing away from the optical waveguide, the transmitting unit follows. The tee coupler of the kind required in the arrangement in the above-cited reference, for instance, thus becomes unnecessary. The radiation emitted by the transmitting unit is injected into an $SiO_2$ waveguide layer on a supporting substrate, carried past the receiving unit, and injected into the optical waveguide from the waveguide layer. The reference also proposes tuning the reception and transmission wavelengths of the two units to one another. Thus the corresponding transmitting unit emits at a wavelength at which the respective receiving unit does not respond. A problem with such an arrangement is the requisite high expense in production terms, since first the waveguide layer must be applied to the semiconductor supporting substrate, and then the semiconductor stack of transmitting units and receiving units must be applied over that. Hence complicated semiconductor production techniques are required to manufacture this component. Furthermore, in the proposed arrangement, problems arise when the radiation emitted by the transmitting unit is injected into the waveguide layer and from there into the optical waveguide. Injection losses at these locations can hardly be avoided, and thus the overall efficiency of this arrangement suffers in turn. It should also be noted that the respective active layer regions of the two semiconductor components are oriented relative to the optical axis in such a way that the optical axis is located in the plane of each of the active regions, or is oriented parallel to that. Depending on the manner of imposition on this element of the radiation that leaves the exit face of the optical waveguide, additional problems arise. For instance, in the case of direct irradiation of this element via the optical waveguide, adjustment problems arise. Then a relatively narrow surface area of the receiving element must be oriented as highly exactly as possible relative to the extraction end of the optical waveguide, which requires corresponding effort and expense in the assembly process. Conversely, if provision is made for imposition by injecting the radiation of the optical waveguide into the waveguide layer, then once again the losses and problems already discussed above occur upon injecting and extracting this radiation.

SUMMARY OF THE INVENTION

An advantage and object of the present invention is therefore to refine the optoelectronic transceiver for bidirectional data transmission by optical waveguides, as generically defined at the outset, in such a way that in particular still further-increased insensitivity with regard to the adjustment of the various elements relative to the optical waveguide and thus a reduced effort and expense of assembly results. Furthermore, the simplest possible production of such a device is desirable.

This advantage and object is attained by an optoelectronic transceiver having an optoelectronic transmitting unit disposed along an optical axis and having a radiation-emitting layer region and an active radiation-sensitive layer region. The optoelectronic transceiver further including an optoelectronic receiving unit disposed along the optical axis and is disposed in bridge-like fashion above the optoelectronic transmitting unit. The optoelectronic receiving unit having an active radiation-sensitive layer region disposed perpendicular to the optical axis and located in a thin membrane, which is disposed immediately in front of the radiation-emitting layer region of the optoelectronic transmitting unit, and a radiation-emitting layer region.

According to the present invention, it is now provided that at least the active radiation-sensitive layer region of the receiving unit be disposed perpendicular to the axis of the receiving unit, along which the receiving unit and the transmitting unit are disposed. This axis is preferably predetermined by the optical axis of symmetry of the optical waveguide. This arrangement becomes possible in particular by the use according to the present invention of special optoelectronic receiving units, in which the active layer region is located in a thin membrane through which light can be projected by the transmitting unit. Since the radiation-sensitive surface of the receiving unit is now relatively large compared with the end face or exit face of the optical waveguide, the result at least for the optoelectronic receiving unit is a suitably wide tolerance range, within which this element can be mounted, correctly adjusted, in front of the exit face of the optical waveguide.

Furthermore, the transmitting unit can also be disposed relative to the optical axis in such a way that the plane of the active light-emitting region is likewise oriented perpendicular to the optical axis. In principle, an exact alignment of this component with the optical waveguide, because of the usual projection characteristics, is not as critical, and thus this provision can be made optional.

Since furthermore provision for direct projection through the receiving unit of the radiation emitted by the transmitting unit is provided, the aforementioned problems with regard to the otherwise required waveguide layer on a supporting substrate do not occur.

There are in principle a number of possible ways for how the two transmitting and receiving units can be suitably disposed to one another and how in particular the respective transmitting and receiving units can be contacted.

A further advantage that can be identified is that the required optical waveguide in the apparatus of the present invention needs to be oriented only relatively coarsely relative to the optoelectronic components and fixed on a suitable housing; for this purpose, a suitable plug connector is preferably provided. By comparison, the variants in the prior art require a separate module housing, out of which the optical waveguide, adjusted with high precision, must be extended outward in the form of a so-called pigtail, which in turn must be connected to a downstream optical waveguide via suitable coupling elements.

Further objects, advantages and details of the optoelectronic transceiver according to the present invention will become apparent from the ensuing description of various exemplary embodiments in conjunction with the accompanying figures.

DESCRIPTION OF THE PREFERRED EMBODIMENTS

Figure 1:
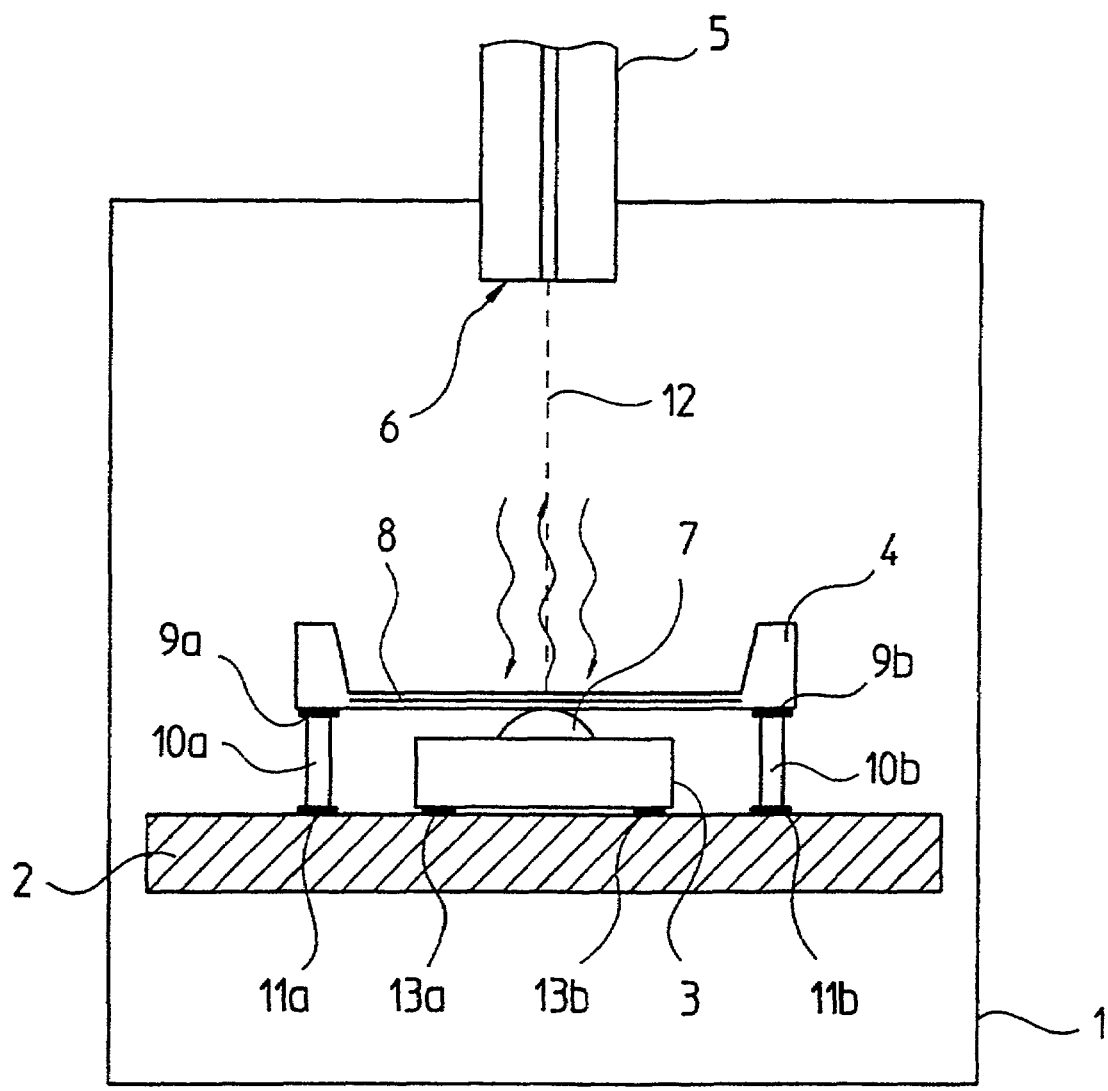
FIG. 1 is a schematic view of a first exemplary embodiment of an optoelectronic transceiver according to the present invention.

From the schematic illustration in FIG. 1, a first embodiment of an optoelectronic transceiver according to the present invention will now be described.

A substrate element 2, embodied for instance as a printed circuit board, is disposed in a suitable housing 1. The elements of the present invention are disposed on the substrate element 2, and besides performing mechanical supporting and stabilizing functions, the substrate element 2 also serves to contact the optoelectronic components disposed on it. To that end, suitable conductor tracks, not visible in FIG. 1, however, are provided in the substrate element 2. As the essential components relative to the function of the optoelectronic transceiver according to the invention, a transmitting unit 3 and a receiving unit 4 are provided on the substrate element 2; they are oriented at a certain spatial relative orientation to an optical waveguide 5, or to its end face 6 that faces toward the optoelectronic transceiver. In this exemplary embodiment, the optical waveguide 5 has a two-part structure, including an optical waveguide core and an optical waveguide sheath. The end face 6 of the optical waveguide is held by suitable structural provisions in a fixed relative orientation to the transmitting unit and receiving unit 3, 4. Various options can be considered for this purpose, such as suitable plug connectors, etc. It is understood that various options also exist with regard to the structure of whatever optical waveguide is used.

Both the transmitting unit 3 and the receiving unit 4 are disposed adjacent along a common axis 12, which in the exemplary embodiment shown is defined by the optical axis of symmetry of the optical waveguide 5. Because of this arrangement, there is no need for an optical tee coupler, of the kind otherwise typically required for deflecting the radiation arriving from the optical waveguide 5 to the receiving unit 4 and for deflecting and injecting the radiation, emitted by the transmitting unit 3, into the optical waveguide 5.

Furthermore, and based in particular on the choice of a particular receiving unit 4 and the corresponding arrangement thereof relative to the optical axis 12, it is assured that the relative orientation of the receiving unit 4 to the end face 6 of the optical waveguide 5 is possible with relatively wide tolerances. Thus the selected optoelectronic receiving unit 4 has a radiation-sensitive layer region 8—merely indicated schematically—that is located in the plane of a thin membrane and is disposed perpendicular to the optical axis 12. The plane of the active layer region 8 or radiation-sensitive surface in which the signal generation occurs from the incidence of the indicated radiation, is accordingly oriented perpendicular to the plane of the drawing. The radiation-sensitive surface of the receiving unit 4, which accordingly corresponds to the surface area of the active layer region 8, is thus especially large relative to the exit face of the respective optical waveguide, or in the instance shown relative to the core region or core surface in the end face 6. The overall result of this arrangement is therefore markedly reduced effort and expense of adjustment, which pertains to the exact positioning of the receiving unit 4 relative to the radiation-emitting region of the end face 6 of the optical waveguide 5. At this location, a conventional plug connector can for instance be used, since there are no stringent demands with regard to the relative orientation of the optical waveguide 5 and the receiving unit 4 as a result.

As already noted, this is achieved primarily by the choice according to the present invention of the optoelectronic receiving unit 4. For a detailed description of this component see International Patent Disclosure WO 96/36999 of the present Applicant the entire contents of which are hereby expressly incorporated by reference. WO 96/36999 corresponds to U.S. Pat. No. 5,852,322, the entire contents of which are incorporated herein by reference.

The membrane region of the receiving unit 4 having the active radiation-sensitive layer region 8 is embodied as so thin, in one possible embodiment on the order magnitude of about 2 µm, that the transmitting unit 3 can project light through this membrane region. The transmitting unit 4 is accordingly also disposed along the optical axis 12, specifically downstream of the receiving unit 4 from the standpoint of the optical waveguide 5. In the radiation-emitting surface region of the transmitting unit 3, a beam shaping optical element 7 is provided in the exemplary embodiment shown, which can be embodied for instance as a lens with suitable optical properties.

As an alternative, it would also be possible to embody the beam shaping optical element 7 at this point with a so-called optical gel. In addition, the beam shaping optical element 7 could also be embodied as a Fresnel structure or as a grating structure on the underside of the membrane, that is, on the side of the receiving unit 4 facing toward the transmitting unit 3; this side would have to be structured to suit this purpose.

Essentially, the beam shaping optical element 7 accomplishes focusing of the radiation, emitted by the optoelectronic transmitting unit 3, onto the end face 6 of the optical waveguide 5. In the case where an optical gel is used at this point, reflections from the various boundary faces and air gaps, which would each cause a loss of efficiency, can also be avoided.

In the first exemplary embodiment shown, the geometrical dimensioning of the active radiation-sensitive surface of the receiving unit 4 is selected such that this surface covers the required surface of the transmitting unit on the substrate element 2. As a result, along with simple assembly of the overall arrangement, this also makes it possible to contact the various optoelectronic components on the substrate element 2.

The most various optoelectronic semiconductor components can be considered for the transmitting unit 3, such as LEDs, laser diodes, and so forth.

Since the relative adjustment of the transmitting unit 3 to the optical waveguide 5 is as a rule not so problematic, because of the typical projection characteristics, as the adjustment of (conventional) receiving units, it is not absolutely necessary within the scope of the present invention for the active radiation-emitting layer regions of the transmitting unit 3 also to be oriented perpendicular to the optical axis 12. Accordingly, transmitting units in which the active radiation-emitting layer region in the extension of the optical axis 12 is oriented parallel to it, or perpendicular to it, could accordingly be disposed along the optical axis 12.

Within the scope of the present invention, the most various combinations of transmitting and receiving wavelengths can be employed for the bidirectional data transmission.

For instance, it is possible to select the transmitting unit and receiving unit 3, 4, and thus the corresponding transmitting and receiving wavelengths $\lambda_S$, $\lambda_E$, such that as much as possible they do not affect the respective other unit. Depending on the semiconductor materials used in the two optoelectronic components, the emitted wavelength $\lambda_S$ of the transmitting unit 3 varies, or the response characteristic of the receiving unit 4 and thus its wavelength $\lambda_E$ varies with maximum response sensitivity.

Thus in one possible embodiment of the apparatus according to the invention, it can be provided that if at all possible the emitted wavelength $\lambda_S$ of the transmitting unit 2 does not coincide with the wavelength $\lambda_E$ at which the receiving unit 4 primarily responds. In the case of such a choice of the respective wavelengths $\lambda_S$, $\lambda_E$, so-called full duplex operation of the optoelectronic transceiver of the invention would be possible, that is, the simultaneous transmission and reception of data via the coupled optical waveguide 5.

Alternatively, however, it is also possible for the respective wavelengths $\lambda_S$, $\lambda_E$ or wavelength ranges not to be tuned in such a way to one another, and by suitable timed triggering of the two semiconductor components 3, 4 to assure that in the course of signal transmission, either only transmission or only reception will be done. This would then correspond to a so-called half duplex mode of the optoelectronic transceiver according to the invention.

In one possible embodiment in the half duplex mode, a transmitting unit 2 would for instance be provided for which $\lambda_S$=850 nm. The maximum sensitivity of the receiving unit 4 is then in the same wavelength range, that is, $\lambda_E$=850 nm.

In that case, the thickness of the radiation-sensitive layer region in the receiving unit 4 would be selected as approximately 2 μm, which in the membrane region would result in a transmission factor of 50% at the selected wavelengths $\lambda_S$, $\lambda_E$=850 nm.

With regard to the optoelectronic transceivers 3, 4, many optional choices are thus available within the scope of the present invention.

In the exemplary embodiment of FIG. 1, the contacting of the transmitting unit and receiving unit 3, 4 always takes place from the back side of the respective units. The back side is understood to mean that side oriented facing away from the optical waveguide 5. Thus schematic contacting elements 13a, 13b are shown in suggested form on the back side of the transmitting unit 3, and by way of them the transmitting unit 3 is connected to conductor tracks in the substrate element 2 and thus is connected to a downstream triggering and evaluation unit, also not shown in FIG. 1. Also on its back side, the receiving unit 4 has contacting elements 9a, 9b, which are connected in turn to electrically conductive spacers 10a, 10b. On the opposite end, the spacers 10a, 10b are connected via further contacting elements 11a, 11b also to conductor tracks in the substrate element 2, by way of which the electrical connection of the receiving unit to the aforementioned triggering and evaluation unit is made.

Contacting of the two semiconductor components 3, 4 in this way proves to be advantageous in the sense that the components can be mounted on the substrate element 2 or circuit board relatively simply, employing known surface mounting device (SMD) assembly methods.

Figure 2:
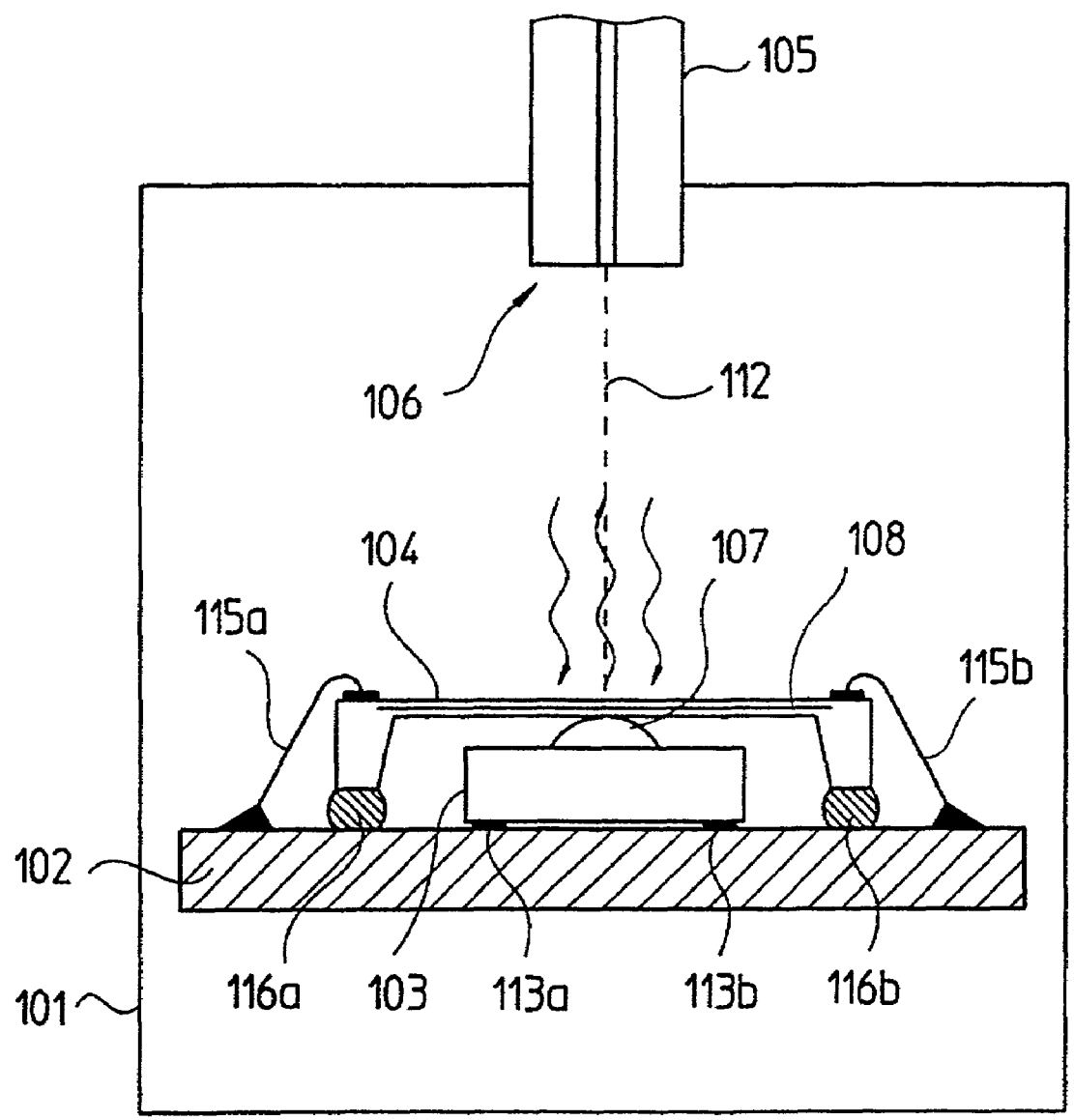
FIG. 2 schematically shows a second embodiment of an optoelectronic transceiver according to the present invention.

An alternative second embodiment of the apparatus of the invention is shown schematically in FIG. 2. It is essentially distinguished only in the manner of electrical contacting of the transmitting unit and receiving unit 103, 104 disposed on the substrate element 102 in the housing 101. While once again the contacting of the transmitting unit 103 is effected with the aid of the contacting elements 113a, 113b disposed on the back side, an alternative contacting variant is intended only for the receiving unit 104. Thus the receiving unit 104 is secured to the substrate element 102 via insulating elements 116a, 116b, while the contacting is done via bond wires 115a, 115b, which are disposed in the case of the receiving unit 104 on the side that faces counter to the radiation to be detected, or in other words its front side.

Otherwise, this embodiment of the apparatus of the invention again corresponds to the preceding variant in terms of the relative disposition of the various elements with regard to the axis 112, and so forth.

Figure 3:
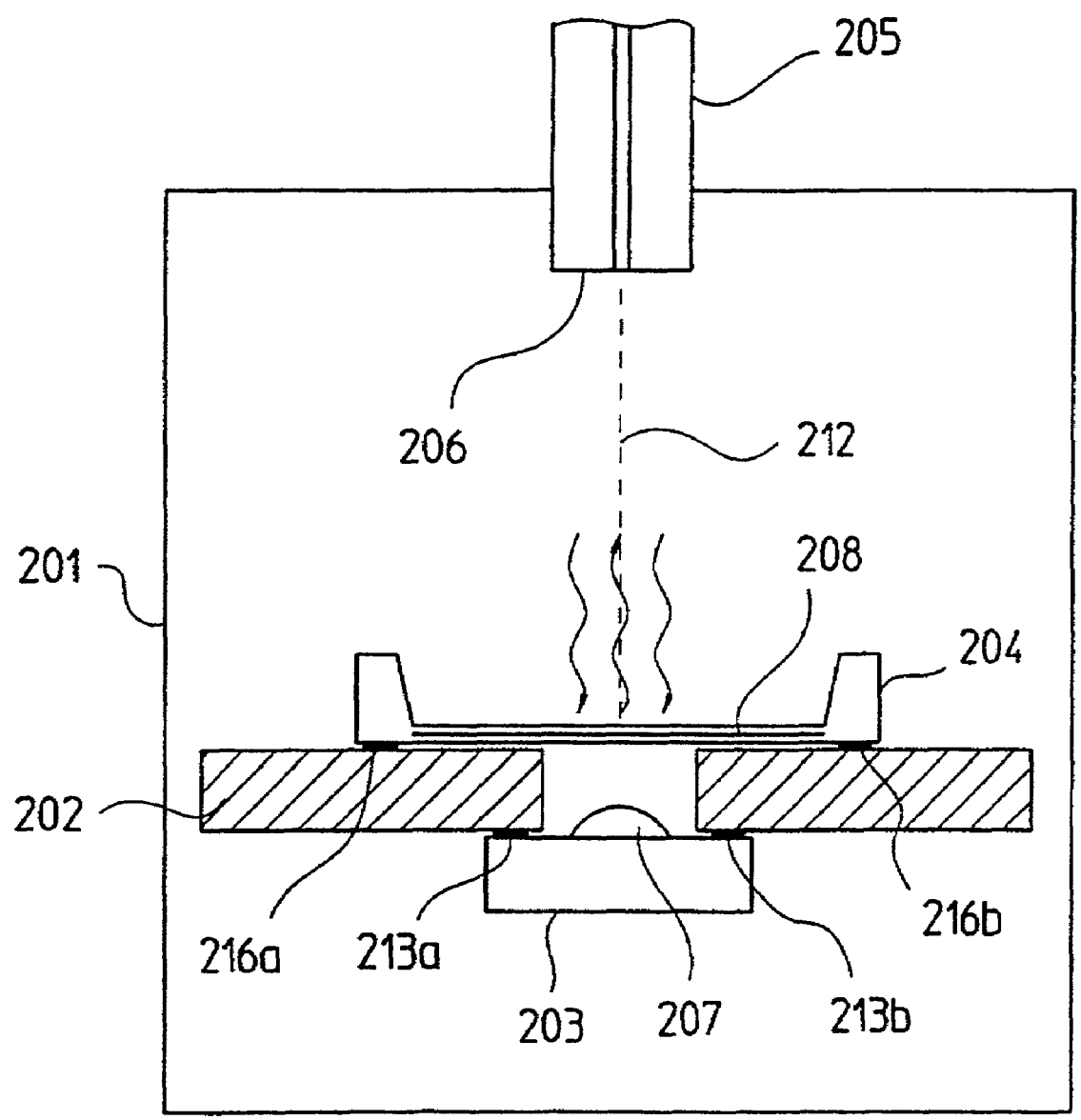
FIG. 3 schematically shows a third embodiment of an optoelectronic transceiver according to the present invention.

A third embodiment of the optoelectronic transceiver according to the invention is schematically shown in FIG. 3. Once again, this exemplary embodiment is distinguished from the preceding variants primarily in the selected manner of contacting the transmitting unit and receiving unit 203, 204, and merely offers certain advantages with regard to the possibly fully automatic SMD assembly.

Thus a substrate element 203 is now provided in the housing 201, and this element has an opening or recess 220 in a portion of it. Both the transmitting unit 203 and the receiving unit 204 are disposed in the region of this opening. The disposition of the transmitting unit 203 is done on the side of the substrate element 202 that is oriented facing away from the optical waveguide 205. The beam shaping optical element 207, embodied as a lens, is disposed in the region of opening 220.

The contacting of the transmitting unit 204 is done via contacting elements 2013a, 213b, which are disposed on the front side of the transmitting unit 204, that is, the side facing toward the optical waveguide 205. In this embodiment, the transmitting unit 204 is thus contacted on its front side.

The optoelectronic receiving unit 204, conversely, is again contacted and connected to the substrate element 202 from the side oriented facing away from the optical waveguide 205 or its end face 206. To that end, suitable contacting elements 216a, 216b are provided between the back side of the receiving unit 204 and the substrate element 202 and the conductor tracks disposed therein.

Otherwise, this exemplary embodiment again corresponds with regard to the disposition of the various components and so forth to the variants already described above.

Figure 4A:
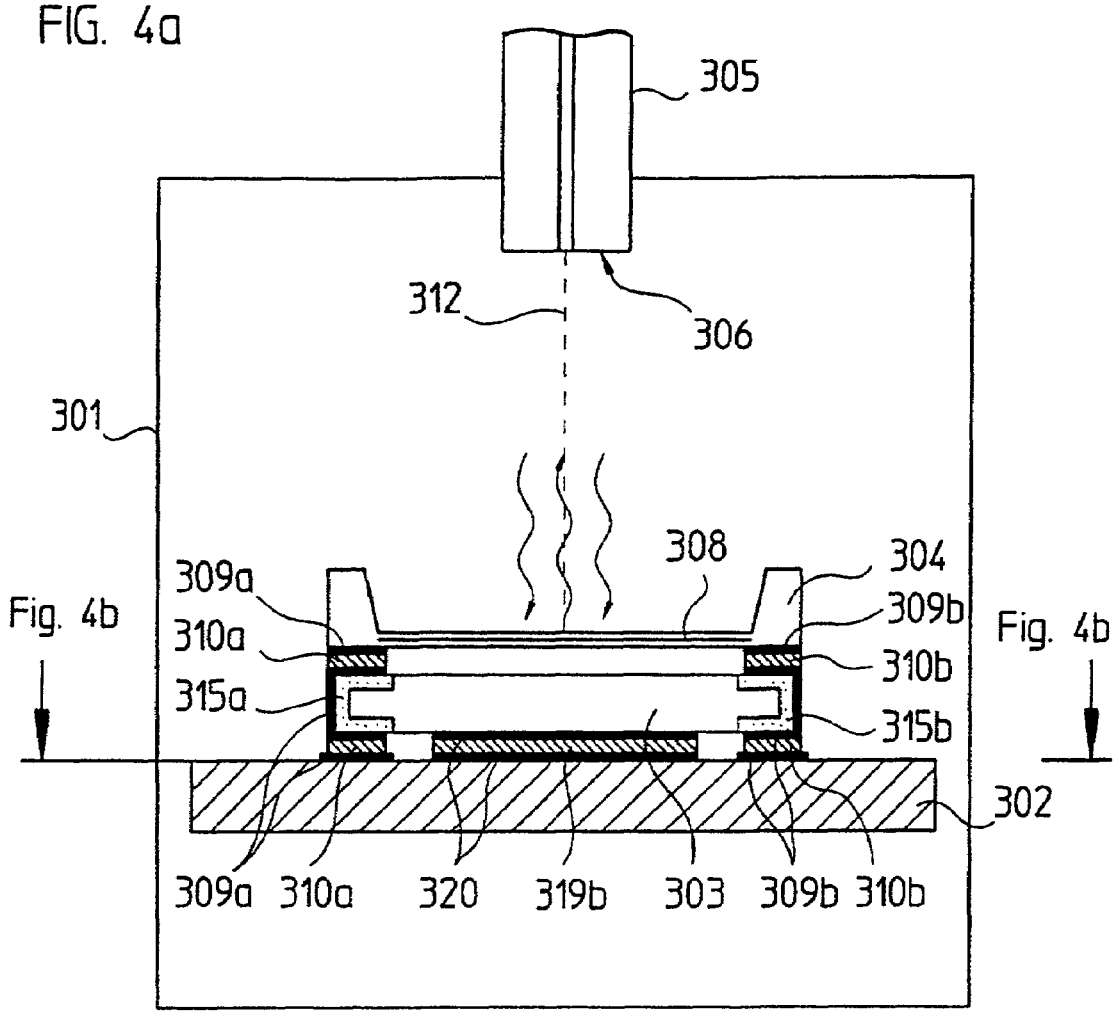
FIGS. 4a and 4b show various views of a fourth embodiment of an optoelectronic transceiver according to the present invention.
Figure 4B:
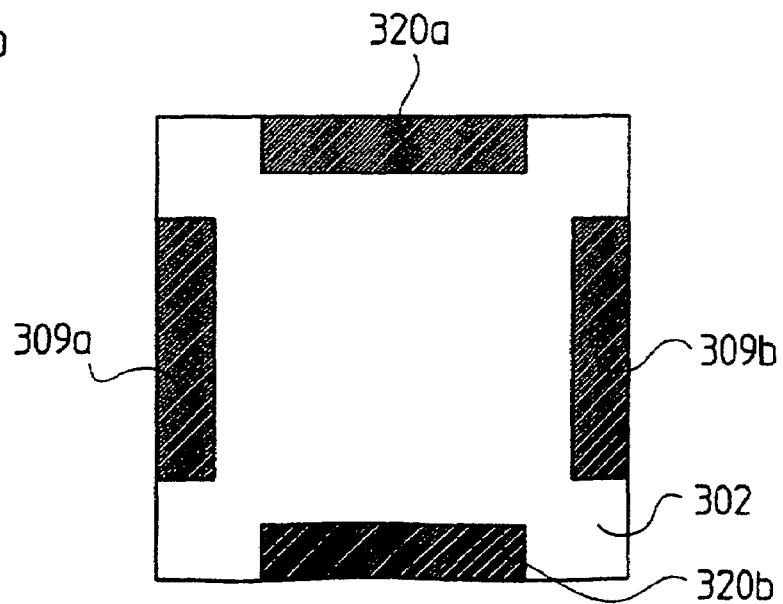

A fourth embodiment of the optoelectronic transceiver of the invention is shown in FIGS. 4a and 4b in various views. The essential distinctions from the variants described above are again to be seen in terms of the manner of contacting the transmitting unit and receiving unit 303, 304.

Thus the disposition of the transmitting unit 303 is done on a substrate element 302, and for contacting this element 302, rectangular contacting elements 320a, 320b are provided, both on the transmitting unit 303 and on the substrate element 302. Via a conductive contacting material 319b, such as a suitable solder, disposed between them, the conductive connection with conductor tracks in the substrate element 302 is made. The contacting regions 320a, 320b are disposed here on opposite sides of the transmitting unit 303. 90° away from them is a further pair of contacting elements 309a, 309b for the receiving unit 304, and between these elements, there is once again a conductive contacting material 310a, 310b. These contacting elements 309a, 309b accordingly serve to contact the receiving unit 304 disposed above the transmitting unit 303. A total of three contacting elements 309a, 309b is disposed on each side, that is, one each on the underside of the receiving unit 304, on the side face of the transmitting unit 303, and on the substrate element 302. In order to prevent the contacting elements 309a, 309b, in particular, that are disposed on the side faces of the transmitting unit 303 from coming into contact with the transmitting unit 303, U-shaped separation elements 315a, 315b are provided, clasping this region, on the corresponding side faces of the transmitting unit 303.

As to the rest of the basic design, such as the disposition of the radiation-sensitive layer region 308 in the receiving unit 304, this exemplary embodiment again corresponds to the variants described above. It is understood that once again a suitable beam shaping optical element can be provided between the transmitting unit 303 and the receiving unit 304, and so forth.

Figure 5:
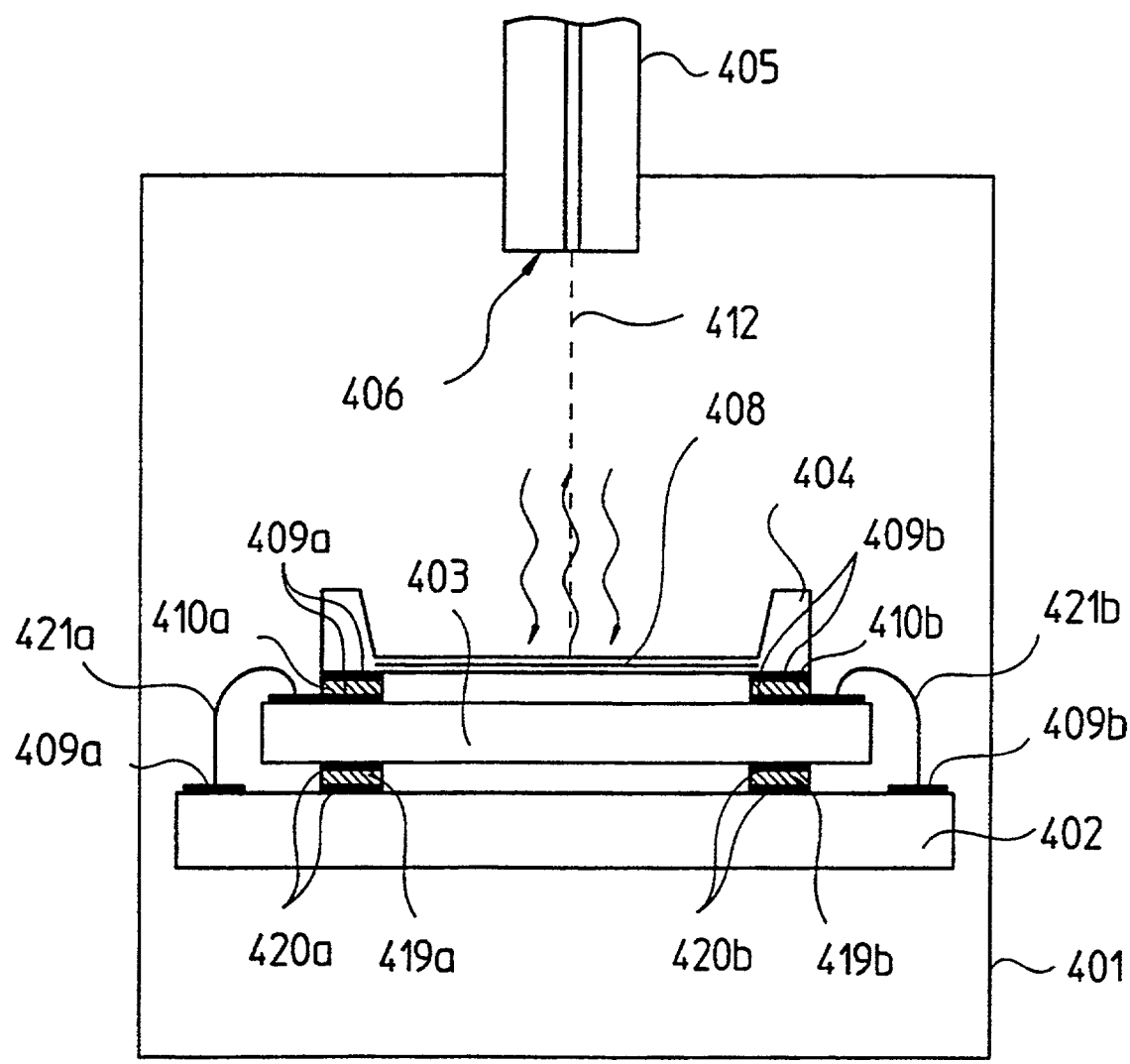
FIG. 5 schematically shows a fifth embodiment of an optoelectronic transceiver according to the present invention.

A fifth variant of the optoelectronic transceiver of the invention is schematically shown in FIG. 5. Below, only the special manner of contacting the various components will be addressed; the fundamental design is identical to that of the preceding embodiments.

In this case, a transmitting unit 403 is now disposed on a substrate element 402, whose total area is greater than that of the receiving unit 404 disposed above it. Because of this arrangement, the contacting of the receiving unit 404 is possible via bond wires 421a, 42b, which connect various contacting elements 409a, 409b to one another. Here the contacting elements 409a, 409b are disposed on the underside of the receiving unit 404, on portions of the top side of the transmitting unit 403, and on the substrate element 402. Via the bond wires 421a, 421b, a conductive connection is established between the contacting elements on the top side of the transmitting unit 403 and those on the substrate element 402. Once again, an electrically conductive contacting material 410a, 410b is provided between the contacting elements 409a, 409b on the underside of the receiving unit and the contacting elements 409a, 409b disposed on the top side of the transmitting unit 403. The contacting of the transmitting unit 403 is done via contacting elements 420a, 420b, which on the one hand are disposed on the underside of the transmitting unit 403 and on the substrate element 402; between each of them, a conductive contacting material 419a, 419b is provided.

While in all the previous exemplary embodiments the contacting of the receiving unit has been made by means of a suitable geometrical embodiment and/or disposition of the two units and by a suitable disposition of various contacting elements, and so forth, a fundamentally alternative embodiment for this purpose would also be possible. For instance, suitable bores or narrow holes could be made in peripheral regions of the transmitting unit and filled with conductive contacting material, thus enabling the receiving unit, located at the top, to be contacted through the transmitting unit. The bores or holes required for this purpose could be made by a so-called thermomigration method or by drilling using lasers.

A sixth embodiment of the apparatus of the invention will now be described in closing, in conjunction with a fragmentary view in FIG. 6.

All that is shown here is the arrangement, located in a housing 601, that comprises a transmitting unit 603, receiving unit 604 and optical waveguide 605. The optical waveguide 605, or its end face 606, is now disposed directly in a recess of the receiving unit 604. The recess is provided here in a region of the receiving unit 604 in which the membrane-like portion of the receiving unit 604, in which the active layer region 608 is disposed, is also located. The transmitting unit 603 is disposed above the membrane having the active layer region 608. The radiation-emitting face of the transmitting unit 603 is oriented in the direction of the recess or the end face 603 of the optical waveguide 605. Contacting of the transmitting unit 603 is done with the aid of contacting elements—not shown—that are disposed between the light-emitting side of the transmitting unit 603 and the receiving unit. The contacting elements—also not shown—of the receiving unit 604 can for instance be disposed beside them, that is, on the top side of the receiving unit 604.

Figure 6:
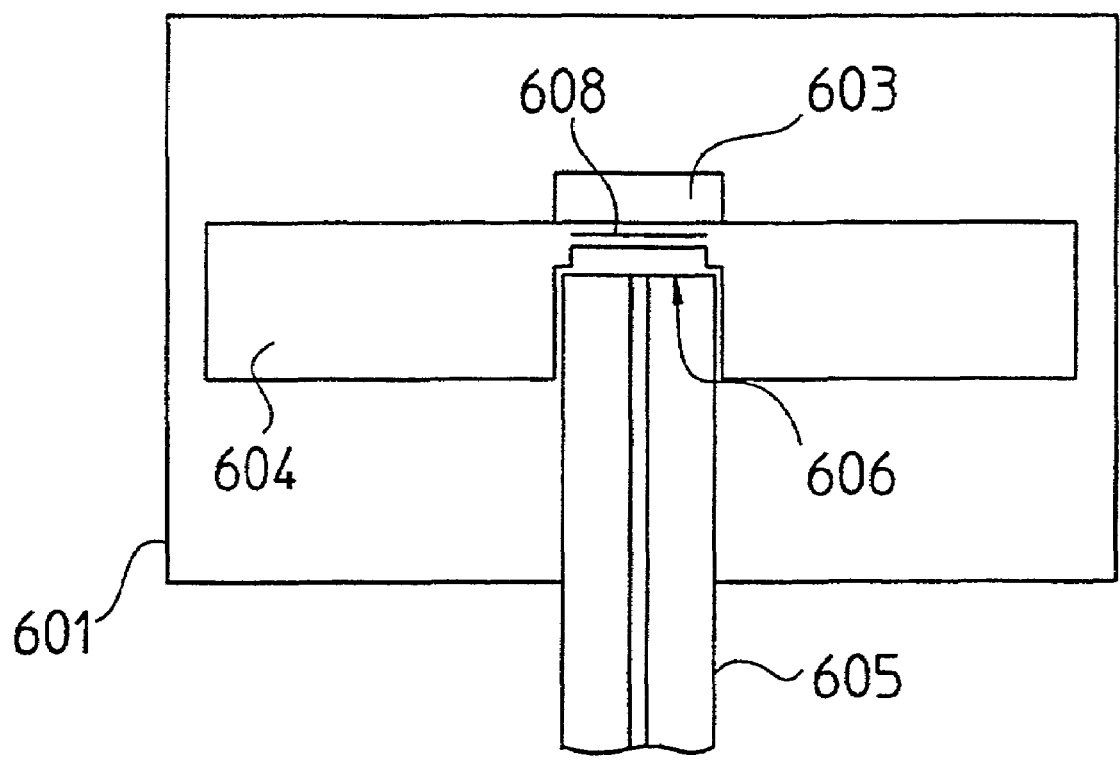
FIG. 6 schematically shows a sixth embodiment of an optoelectronic transceiver according to the present invention.

The contacting elements of the two optoelectronic components 603, 604 are then also connected to the corresponding contacting elements on a substrate element in the housing, also not shown in FIG. 6.

A fixation of the entire arrangement comprising the optical waveguide 605 and two units 603, 604 could be done for instance by adhesive bonding or by encapsulation.

As has become clear from the preceding description of several exemplary embodiments, a number of possibilities thus exist for advantageously embodying the present invention. It is understood that the provisions explained in conjunction with the various exemplary embodiments can also be suitably combined, in the final analysis resulting in manifold options for realizing the present invention.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

We claim:

1. An optoelectronic transceiver, comprising:
   a substrate element comprising a first electrical conductor track and a second electrical conductor track;
   an optoelectronic transmitting unit disposed on a portion of said substrate element and electrically connected to said first electrical conductor track, said optoelectronic transmitting unit comprising:
      a radiation-emitting layer region; and
   an optoelectronic receiving unit electrically connected to said second electrical conductor track and is disposed in bridge-like fashion above said optoelectronic transmitting unit along a common optical axis via a spacer attached to said substrate so that said optoelectronic receiving unit is spaced from said substrate, said optoelectronic receiving unit comprising:
      an active radiation-sensitive layer region disposed perpendicular to said optical axis and located in a thin membrane, which is disposed immediately in front of said radiation-emitting layer region of said optoelectronic transmitting unit.

2. The optoelectronic transceiver of claim 1, further comprising an optical radiation shaping element disposed between said thin membrane and said radiation-emitting region of said optoelectronic transmitting unit.

3. The optoelectronic transceiver of claim 2, wherein said optical radiation shaping element comprises a lens with a focusing action.

4. The optoelectronic transceiver of claim 2, wherein said optical radiation shaping element comprises an optical gel.

5. The optoelectronic transceiver of claim 1, wherein said active radiation-emitting layer region of said optoelectronic transmitting unit is disposed perpendicular to said optical axis.

6. The optoelectronic transceiver of claim 1, wherein said substrate element has a recess, and said radiation-emitting region of said optoelectronic transmitting unit and at least a portion of said active layer region of said optoelectronic receiving unit are disposed in the region of said recess, and said optoelectronic transmitting unit and said optoelectronic receiving unit are disposed on two different sides of said substrate element.

7. The optoelectronic transceiver of claim 1, wherein contacting of said receiving unit, disposed above said optoelectronic transmitting unit, is effected by contacting elements which are disposed on side faces of said optoelectronic transmitting unit.

8. The optoelectronic transceiver of claim 1, wherein said optoelectronic receiving unit is embodied as smaller in surface area than said optoelectronic transmitting unit.

9. The optoelectronic transceiver of claim 1, wherein said substrate element is substantially planar along a plane that is substantially perpendicular to said optical axis.

10. A radiation transmission system, comprising:
    a waveguide that emits radiation out of an end face along an optical axis; and
    an optoelectronic transceiver that receives said radiation, said optoelectronic transceiver comprising:
       a substrate element comprising a first electrical conductor track and a second electrical conductor track;
       an optoelectronic transmitting unit disposed on a portion of said substrate element and electrically connected to said first electrical conductor track, said optoelectronic transmitting unit comprising:
       a radiation-emitting layer region; and
       an optoelectronic receiving unit electrically connected to said second electrical conductor track and is disposed in bridge-like fashion above said optoelectronic transmitting unit along a common optical axis via a spacer attached to said substrate so that said optoelectronic receiving unit is spaced from said substrate, said optoelectronic receiving unit comprising:
          an active radiation-sensitive layer region disposed perpendicular to said optical axis and located in a thin membrane, which is disposed immediately in front of said radiation-emitting layer region of said optoelectronic transmitting unit.

11. The radiation transmission system of claim 10, further comprising an optical radiation shaping element disposed between said thin membrane and said radiation-emitting region of said optoelectronic transmitting unit.

12. The radiation transmission system of claim 11, wherein said optical radiation shaping element comprises a lens with a focusing action.

13. The radiation transmission system of claim 11, wherein said optical radiation shaping element comprises an optical gel.

14. The radiation transmission system of claim 10, wherein said radiation-sensitive area of said optoelectronic receiving unit is large when compared to said radiation-emitting portion of said end face of said optical waveguide.

15. The radiation transmission system of claim 10, wherein said active radiation-emitting layer region of said optoelectronic transmitting unit is disposed perpendicular to said optical axis.

16. The radiation transmission system of claim 10, wherein contacting of said optoelectronic transmitting unit is effected from a side that is oriented facing away from said optical waveguide.

17. The radiation transmission system of claim 10, wherein said substrate element has a recess, and said radiation-emitting region of said optoelectronic transmitting unit and at least a portion of said active layer region of said optoelectronic receiving unit are disposed in the region of said recess, and said optoelectronic transmitting unit and said optoelectronic receiving unit are disposed on two different sides of said substrate element.

18. The radiation transmission system of claim 10, wherein contacting of said receiving unit, disposed above said optoelectronic transmitting unit, is effected by contacting elements which are disposed on side faces of said optoelectronic transmitting unit.

19. The radiation transmission system of claim 18, wherein said optoelectronic receiving unit as well as said optoelectronic transmitting unit are embodied as approximately of equal size in terms of surface area.

20. The radiation transmission system of claim 10, wherein said end face of said optical waveguide is disposed in a recess of said optoelectronic receiving unit in which said thin membrane having said active layer region is also located, and said optoelectronic transmitting unit is disposed on a side of said optoelectronic receiving unit opposite from said optical waveguide.

21. The radiation transmission system of claim 10, wherein said substrate element is substantially planar along a plane that is substantially perpendicular to said optical axis.

* * * * *